United States Patent
Nagata et al.

(10) Patent No.: US 9,165,750 B2
(45) Date of Patent: Oct. 20, 2015

(54) HIGH PURITY COPPER—MANGANESE ALLOY SPUTTERING TARGET

(71) Applicant: JX Nippon Mining & Metals Corporation, Tokyo (JP)

(72) Inventors: Kenichi Nagata, Ibaraki (JP); Tomio Otsuki, Ibaraki (JP); Takeo Okabe, Ibaraki (JP); Nobuhito Makino, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 14/353,322

(22) PCT Filed: Jan. 4, 2013

(86) PCT No.: PCT/JP2013/050002
§ 371 (c)(1),
(2) Date: Apr. 22, 2014

(87) PCT Pub. No.: WO2013/111609
PCT Pub. Date: Aug. 1, 2013

(65) Prior Publication Data
US 2014/0284211 A1    Sep. 25, 2014

(30) Foreign Application Priority Data
Jan. 23, 2012   (JP) .................................. 2012-011235

(51) Int. Cl.
| | |
|---|---|
| *H01J 37/34* | (2006.01) |
| *C22C 9/00* | (2006.01) |
| *C22C 9/05* | (2006.01) |
| *C22C 1/04* | (2006.01) |
| *C23C 14/14* | (2006.01) |
| *C23C 14/34* | (2006.01) |
| *H01L 23/532* | (2006.01) |

(52) U.S. Cl.
CPC .............. *H01J 37/3426* (2013.01); *C22C 9/05* (2013.01); *C23C 14/3407* (2013.01); *H01J 37/3429* (2013.01); *C22C 1/0425* (2013.01); *C22C 9/00* (2013.01); *C23C 14/14* (2013.01); *C23C 14/3414* (2013.01); *H01L 23/53233* (2013.01); *H01L 2924/0002* (2013.01)

(58) Field of Classification Search
CPC .............. H01J 37/3426; H01J 37/3429; C23C 14/3414; C23C 14/3407; C23C 14/14; H01L 23/53233; C22C 9/05; C22C 9/00
See application file for complete search history.

(56) References Cited

U.S. PATENT DOCUMENTS

| | | | |
|---|---|---|---|
| 7,229,510 B2 | 6/2007 | Nakamura | |
| 7,507,304 B2 | 3/2009 | Okabe et al. | |
| 7,626,665 B2 | 12/2009 | Koike | |
| 7,713,364 B2 | 5/2010 | Nakamura | |
| 7,740,721 B2 | 6/2010 | Okabe | |
| 8,246,764 B2 | 8/2012 | Okabe et al. | |
| 9,090,970 B2 | 7/2015 | Nagata et al. | |
| 2005/0121320 A1 | 6/2005 | Okabe et al. | |
| 2005/0181955 A1 | 8/2005 | Kato | |
| 2007/0051624 A1 | 3/2007 | Okabe et al. | |
| 2009/0101495 A1 | 4/2009 | Aoki et al. | |
| 2009/0140430 A1 | 6/2009 | Okabe et al. | |
| 2010/0013096 A1 | 1/2010 | Irumata et al. | |
| 2010/0219070 A1 | 9/2010 | Okabe | |
| 2011/0066591 A1 | 3/2011 | Moyne et al. | |
| 2011/0163447 A1 | 7/2011 | Fukushima et al. | |
| 2011/0192719 A1 | 8/2011 | Maki et al. | |
| 2011/0281134 A1 | 11/2011 | Maki | |
| 2014/0158532 A1 | 6/2014 | Nagata et al. | |
| 2014/0318953 A1* | 10/2014 | Nagata et al. ............ | 204/298.12 |

FOREIGN PATENT DOCUMENTS

| | | | |
|---|---|---|---|
| CN | 101509125 A | | 8/2009 |
| JP | 63109130 A | * | 5/1988 |
| JP | 63310930 A | * | 12/1988 |
| JP | 11001735 A | * | 1/1999 |
| JP | 2002-294437 A | | 10/2002 |
| JP | 2006-73863 A | | 3/2006 |
| JP | 2008-311283 A | | 12/2008 |
| JP | 2009-074127 A | | 4/2009 |
| JP | 2009-097085 A | | 5/2009 |
| JP | 2010-248619 A | | 11/2010 |

OTHER PUBLICATIONS www.rapidtables.com [http://www.rapidtables.com/convert/number/Percent_to_PPM.htm] [Accessed on May 17, 2015].*

* cited by examiner

*Primary Examiner* — Michael Band
(74) *Attorney, Agent, or Firm* — Howson & Howson LLP

(57) ABSTRACT

A high purity copper-manganese alloy sputtering target containing 0.05 to 20 wt % of Mn and, excluding additive elements, remainder being Cu and unavoidable impurities, wherein the target contains 0.001 to 0.06 wtppm of P and 0.005 to 5 wtppm of S, and further contains Ca and Si, and a total content of P, S, Ca, and Si is 0.01 to 20 wtppm. The incorporation of appropriate amounts of Mn as well as Ca, P, Si, and S in copper improves the machinability that is required in the stage of producing a target to facilitate the manufacture (workability) of the target, improves the smoothness of the target surface, and inhibits the generation of particles during sputtering. Thus, provided is a high purity copper-manganese alloy sputtering target which is particularly useful for improving the yield and reliability of semiconductor products that progress toward miniaturization and integration.

11 Claims, No Drawings

HIGH PURITY COPPER—MANGANESE ALLOY SPUTTERING TARGET

TECHNICAL FIELD

The present invention provides a high purity copper-manganese alloy sputtering target which yields superior machinability of a target material, and in particular relates to a high purity copper-manganese alloy sputtering target which is useful for forming a copper alloy wiring for semiconductors, comprises a favorable self-diffusion suppression function, and can effectively prevent contamination around the wiring caused by the diffusion of active copper.

BACKGROUND ART

An Al alloy (specific resistance of roughly 3.0 $\mu\Omega\cdot$cm) has conventionally been used as the wiring material for a semiconductor device. However, pursuant to the miniaturization of wirings, a copper wiring with lower resistance (specific resistance of roughly 2.0 $\mu\Omega\cdot$cm) has been put into practical application. As the process for forming a copper wiring, generally adopted is the method of forming a diffusion barrier layer made of Ta or TaN on a wiring or a wiring groove, and thereafter subjecting copper to sputter deposition. High purity copper of 5N to 6N is normally produced by performing wet or dry purification to electrolytic copper having a purity level of 4N (excluding gas components) as the crude metal, and this has been used as a sputtering target.

As described above, while copper is extremely effective as a wiring for semiconductors, copper itself is an extremely active metal and diffuses easily, and there is a problem in that copper contaminates the Si substrate or its periphery through the semiconductor Si substrate or the insulator film formed thereon. In particular, pursuant to the miniaturization of wirings, it is no longer sufficient to merely form a conventional Ta or TaN diffusion barrier layer, and improvements in the copper wiring material itself are demanded. Thus, previously, proposed as the copper wiring material was a copper alloy comprising a self-diffusion suppression function which is realized by adding manganese (Mn) to copper (Cu), and reacting the Mn in the Cu—Mn alloy with the oxygen of the insulator film to self-form a barrier layer.

Examples of a Cu—Mn alloy sputtering target are listed below.

Patent Document 1 describes a sputtering target containing 0.1 to 20.0 at % of Mn and remainder being Cu, wherein concentration of unavoidable impurity elements of which the diffusion coefficient is smaller than the self-diffusion coefficient of Cu is 0.05 at % or less.

Patent Document 2 describes a sputtering target containing 0.1 to 1.0 atomic percent of B as an additive element, further containing 0.1 to 2.0 atomic percent of Mn and/or Ni, and remainder being Cu and unavoidable impurities.

Patent Document 3 describes a sputtering target containing 0.1 to 1.0 atomic percent of B as an additive element, further containing 0.1 to 2.0 atomic percent of elements (including Mn) that develop a compound with B, and the remainder being Cu and unavoidable impurities.

Patent Document 4 describes a sputtering target containing one or more components selected from a group of V, Nb, Fe, Co, Ni, Zn, and Mg and one or more components selected from a group of Sc, Al, Y, and Cr so that the total content thereof becomes 0.005 to 0.5 mass percent, further containing 0.1 to 5 ppm of oxygen, and the remainder being Cu and unavoidable impurities.

Patent Document 5 describes a sputtering target containing more than 6 to 20 mole percent of oxygen, further containing one or more types among Mo, Mn, Ca, Zn, Ni, Ti, Al, Mg and Fe in a total amount of 0.2 to 5 mole percent, and the remainder being Cu and unavoidable impurities.

Patent Document 6 describes a sintered sputtering target material formed from metal powder of Mn, B, Bi or Ge and alloy powder or sintered metal containing X (including Cu) and Y, wherein the material contains 50% or more of crystal grains having an average grain size of 0.1 to 300 $\mu$m, and the gas content is 600 ppm or less.

Patent Document 7 describes a sputtering target for inhibiting the generation of particles, wherein the sputtering target contains 0.6 to 30 mass percent of Mn, 40 ppm or less of metal-based impurities, 10 ppm or less of oxygen, 5 ppm or less of nitrogen, 5 ppm or less of hydrogen, 10 ppm or less of carbon, and the remainder being Cu.

In addition, as a wiring material for semiconductor devices proposed by the present Applicant, described is a sputtering target for forming a copper alloy wiring for semiconductors, wherein the material contains 0.05 to 5 wt % of Mn, the total content of one or more elements selected from Sb, Zr, Ti, Cr, Ag, Au, Cd, In, and As is 10 wtppm or less, and the remainder is Cu (refer to Patent Document 8).

Moreover, the present Applicant has previously disclosed a copper alloy wiring material for semiconductors made from a Cu—Mn alloy (refer to Patent Document 9), and in particular proposed a sputtering target, wherein the target contains 0.05 to 20 wt % of Mn, the total content of Be, B, Mg, Al, Si, Ca, Ba, La, and Ce is 500 wtppm or less, and the remainder is Cu and unavoidable impurities.

A copper-manganese alloy sputtering target for use in the foregoing copper alloy wiring and the like for semiconductors aims to improve the performance of the thin film mainly with additive elements.

Generally speaking, upon preparing a target, a copper-manganese alloy ingot obtained through melting and casting is processed into a target shape of a predetermined size, and the surface is thereafter cut to obtain the target. In the foregoing case, the machinability of the target material is an important factor. This is because, since the target is cut and subsequently polished to obtain the ultimate surface form, if the cutting is insufficient, cutting marks will remain on the surface, and it is not possible to obtain the smoothness of the target surface.

When the smoothness of the target surface is improved, it is possible to inhibit the generation of particles during sputtering, and form a thin film with superior uniformity. Nevertheless, the conventional technologies did not develop the target material from this kind of perspective.

Patent Document 1: Japanese Patent No. 4065959
Patent Document 2: JP-A-2009-97085
Patent Document 3: JP-A-2010-248619
Patent Document 4: JP-A-2002-294437
Patent Document 5: JP-A-2008-311283
Patent Document 6: JP-A-2009-74127
Patent Document 7: JP-A-2007-51351
Patent Document 8: JP-A-2006-73863
Patent Document 9: International Publication No. 2008/041535

SUMMARY OF INVENTION

Technical Problem

The present invention improves the machinability of the target material by adding, to copper, an appropriate amount of Mn, and additive elements within a harmless range. Upon preparing a target, a copper-manganese alloy ingot obtained through melting and casting is processed into a target shape of a predetermined size, and the surface is thereafter cut to obtain the target. By improving the machinability of the target material, the present invention aims to improve the workability of the target, improve the smoothness of the target surface, inhibit the generation of particles during sputtering, and thereby form a thin film with superior uniformity.

The yield and reliability of semiconductor products, which progress toward miniaturization and integration, are thereby improved. An object of the present invention is to provide a high purity copper-manganese alloy sputtering target, which is useful for forming a copper alloy wiring for semiconductors, comprises a self-diffusion suppression function that is a unique feature of a high purity copper-manganese alloy, is capable of effectively preventing the contamination around the wiring caused by the diffusion of active Cu, and has superior electromigration (EM) resistance, corrosion resistance, and the like.

Solution to Problem

In order to achieve the foregoing object, the present invention provides the following invention.
1) A high purity copper-manganese alloy sputtering target containing 0.05 to 20 wt % of Mn and, excluding additive elements, remainder being Cu and unavoidable impurities, wherein the target contains 0.001 to 0.06 wtppm of P and 0.005 to 5 wtppm of S, and further contains Ca and Si, and a total content of P, S, Ca, and Si is 0.01 to 20 wtppm.
2) A high purity copper-manganese alloy sputtering target containing 0.05 to 20 wt % of Mn and, excluding additive elements, remainder being Cu and unavoidable impurities, wherein the target contains 0.001 to 0.06 wtppm of P and 0.005 to 5 wtppm of S, and further contains Ca and Si, and a total content of P, S, Ca, and Si is 0.1 to 15 wtppm.
3) A high purity copper-manganese alloy sputtering target containing 0.05 to 20 wt % of Mn and, excluding additive elements, remainder being Cu and unavoidable impurities, wherein the target contains 0.001 to 0.06 wtppm of P and 0.005 to 5 wtppm of S, and further contains Ca and Si, and a total content of P, S, Ca, and Si is 1 to 10 wtppm.

Advantageous Effects of Invention

The high purity copper-manganese alloy sputtering target of the present invention improves the machinability of the target material by adding, to copper, an appropriate amount of Mn, and additive elements within a harmless range. Upon preparing a target, a copper-manganese alloy ingot obtained through melting and casting is processed into a target shape of a predetermined size, and the surface is thereafter cut to obtain the target. By improving the machinability of the target material, the present invention yields a superior effect of being able to improve the workability of the target, improve the smoothness of the target surface, and inhibit the generation of particles during sputtering.

Consequently, it is possible to improve the yield and reliability of semiconductor products that progress toward miniaturization and integration. The present invention yields an effect of being able to provide a high purity copper-manganese alloy sputtering target, which is useful for forming a copper alloy wiring for semiconductors, comprises a self-diffusion suppression function that is a unique feature of a high purity copper-manganese alloy, is capable of effectively preventing the contamination around the wiring caused by the diffusion of active Cu, and has superior electromigration (EM) resistance, corrosion resistance, and the like.

DESCRIPTION OF EMBODIMENTS

In the present invention, the amount of Mn contained in the Cu alloy is desirably 0.05 wt % or more and 20 wt % or less. When the amount of Mn is less than 0.05 wt %, the self-diffusion suppression function will decrease; and when the amount of Mn exceeds 20 wt %, the resistance will increase and the function as the copper alloy wiring for semiconductors will deteriorate. These results are undesirable. More preferably, the copper alloy contains 0.4 to 10 wt % of Mn.

Furthermore in the present invention, Ca, P, Si, and S are contained as additive elements in a total content of 0.01 to 20 wtppm. Preferably, the total content of Ca, P, Si, and S as additive elements is 0.1 to 15 wtppm, and more preferably the total content of Ca, P, Si, and S as additive elements is 1 to 10 wtppm. Moreover, with regard to P and S, P is preferably contained in a range of 0.001 to 0.06 wtppm and S is preferably contained in a range of 0.005 to 5 wtppm.

In the present invention, the Mn composition and components of additive elements were measured by using ICP-AES.

These additive elements improve the machinability of the high purity copper-manganese alloy as the target material. When the total content of additive elements is less than 0.01 wtppm, the machinability cannot be improved; and when the total content of additive elements exceeds 20 wtppm, compounds are formed with carbon, oxygen and the like, and the generation of particles will increase upon sputtering the target. Therefore, the total content of additive elements is preferably kept within the foregoing range. The generation of particles will decrease when the total content of additive elements is within the foregoing range.

When additive elements are added within the foregoing range, since the general workability will increase in addition to the machinability, an effect of being able to facilitate the production of the target and improve the productivity is also yielded. Moreover, when the smoothness of the target surface is improved, it is possible to inhibit the generation of particles during sputtering. As described above, when the additive amount of Ca, P, Si, and S deviates from (is greater than) the foregoing range, it will cause the generation of particles. Moreover, since the crystal grain size of the film will decrease and the grain boundary will increase, the resistance will increase and the electrical conduction property tends to deteriorate.

Moreover, in the present invention, upon producing the high purity copper-manganese alloy sputtering target, high purity copper having a purity level of 6N or higher and manganese as an additive element having a purity level of 5N or higher are placed in a carbon crucible and subject to melting. Otherwise, high purity copper having a purity level of 6N or higher may be melted in a carbon crucible in advance, and manganese having a purity level of 5N or higher may be subsequently added therein to achieve the intended component composition.

When C, P, Si, and S are contained in the high purity manganese raw material, the content thereof may be adjusted at the stage of refining so that the total content becomes 0.01 to 20 wtppm. The high purity copper-manganese alloy referred to in the present invention is a copper-manganese alloy being of high purity excluding additive elements of at least 4N5, and is produced as described above.

By casting the alloy obtained as described above, it is possible to obtain the high purity copper-manganese alloy ingot of the present invention containing 0.05 to 20 wt % of Mn, and additive elements.

Moreover, one or more elements selected from Sb, Zr, Ti, Cr, Ag, Au, Cd, In, As, Be, B, Mg, Al, Si, Ca, Ba, La, and Ce may also be added in the foregoing copper-manganese alloy, as needed, in a total amount of 500 wtppm or less. Since these second additive elements yield the effect of being able to refine the grain size, these elements may be added as needed when control of the crystal grain size is required.

Subsequently, the copper-manganese alloy ingot is subject to hot forging at a predetermined forging ratio, and subsequently rolled at a predetermined rolling reduction to obtain a rolled plate. The obtained rolled plate is additionally subject to heat treatment at a predetermined temperature and for a predetermined time. Subsequently, the rolled plate is subject to surface finishing via grinding and polishing, bonded to a backing plate, and further subject to finishing processing to produce a sputtering target assembly prepared from the high purity copper-manganese alloy.

EXAMPLES

The present invention is now explained based on the Examples. The Examples indicated below are provided for facilitating the understanding of the present invention, and the present invention is not limited by these Examples. In other words, modifications and other examples based on the technical concept of the present invention are also covered by the present invention as a matter of course.

Example 1

In Example 1, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 0.05 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm. Upon preparing this target, cutting (grinding) and polishing were performed using a rotating body comprising abrasive grains. Cutting was comprehensively judged and evaluated based on A: tool wear, B: cutting resistance, C: surface roughness, and D: shape and color of cutting chips. From the perspective of actually producing a target, evaluation was performed based on the foregoing evaluation items of machinability.

With regard to machinability, "⊙ (double circle)" shows that all evaluation items of A to D were favorable, "○" shows that three items among the evaluation items of A to D were favorable, and "X" shows that two or more items among the evaluation items of A to D were inferior. The results of measuring the Mn content and amount of additive elements (impurity element content) and the evaluation result of machinability of the target are shown in Table 1.

Subsequently, for the quality evaluation of the thin film formed by sputtering the obtained target, the target of Example 1 was sputtered to form a thin film, and the generation of particles was evaluated. The results are shown in Table 1.

The particles were evaluated by measuring the number of particles on the film surface by using Surfscan manufactured by KLA-Tencor, and the number of particles of 0.08 µm or larger (particles/wafer) and the number of particles of 0.2 µm or larger (particles/wafer) were counted.

As shown in Table 1, the machinability upon producing the target of Example 1 was favorable. With the thin film formed by using the target of Example 1, the generation of particles was low with the number of particles of 0.08 µm or larger being 11.3 particles/wafer and the number of particles of 0.2 µm or larger being 3.8 particles/wafer.

TABLE 1

| | | Amount of Additive Element (wtppm) | | | | | | Number of Particles | |
| | | | | | | | | 0.2 µm or more | 0.08 µm or more |
| | Mn (wt %) | Ca | P | S | Si | Total | Machinability | (particles/wafer) | (particles/wafer) |
|---|---|---|---|---|---|---|---|---|---|
| Example 1 | 0.05 | 0.03 | 0.01 | 0.005 | 0.005 | 0.05 | ○ | 3.8 | 11.3 |
| Example 2 | 0.05 | 0.63 | 0.05 | 0.5 | 1.3 | 2.48 | ⊙ | 4.2 | 12.8 |
| Example 3 | 0.05 | 10 | 0.03 | 0.05 | 5 | 15.08 | ⊙ | 6.2 | 23.9 |
| Example 4 | 5 | 0.02 | 0.01 | 0.005 | 0.005 | 0.04 | ○ | 3.3 | 10.4 |
| Example 5 | 5 | 0.63 | 0.05 | 0.5 | 1.3 | 2.48 | ⊙ | 4.6 | 13.6 |
| Example 6 | 5 | 12 | 0.04 | 0.06 | 3 | 15.1 | ⊙ | 5.7 | 23.4 |
| Example 7 | 20 | 0.03 | 0.01 | 0.02 | 0.02 | 0.08 | ○ | 3.5 | 11.2 |
| Example 8 | 20 | 0.63 | 0.05 | 0.5 | 1.3 | 2.48 | ⊙ | 4.3 | 11.9 |
| Example 9 | 20 | 13 | 0.06 | 0.05 | 5 | 18.11 | ⊙ | 6.6 | 19.7 |
| Example 10 | 0.05 | 0.003 | 0.001 | 0.005 | 0.001 | 0.01 | ○ | 3.2 | 10.9 |
| Example 11 | 0.05 | 8 | 0.05 | 5 | 6 | 19.05 | ⊙ | 5.9 | 22.9 |
| Example 12 | 5 | 0.001 | 0.001 | 0.005 | 0.003 | 0.01 | ○ | 3.1 | 11.3 |
| Example 13 | 5 | 7 | 0.05 | 5 | 7 | 19.05 | ⊙ | 6.2 | 25.3 |
| Example 14 | 20 | 0.002 | 0.001 | 0.005 | 0.002 | 0.01 | ○ | 3.5 | 13.2 |
| Example 15 | 20 | 7 | 0.05 | 5 | 7 | 19.05 | ⊙ | 7.9 | 22.1 |
| Comparative Example 1 | 0.05 | 0.002 | 0.001 | 0.001 | 0.001 | 0.005 | X | 3.1 | 9.5 |
| Comparative | 0.05 | 25 | 1 | 0.5 | 2 | 28.5 | X | 35.3 | 89.3 |

TABLE 1-continued

| | Amount of Additive Element (wtppm) | | | | | | Number of Particles | |
| | | | | | | | 0.2 μm or more | 0.08 μm or more |
| | Mn (wt %) | Ca | P | S | Si | Total | Machinability | (particles/wafer) | (particles/wafer) |
|---|---|---|---|---|---|---|---|---|---|
| Example 2 | | | | | | | | | |
| Comparative Example 3 | 0.05 | 3 | 1.1 | 0.8 | 21 | 25.9 | X | 23.2 | 98.7 |
| Comparative Example 4 | 5 | 0.003 | 0.001 | 0.001 | 0.002 | 0.007 | X | 3.4 | 9.8 |
| Comparative Example 5 | 5 | 24 | 0.9 | 0.5 | 2.3 | 27.7 | X | 26.9 | 87.3 |
| Comparative Example 6 | 5 | 2.9 | 1.5 | 0.7 | 27 | 32.1 | X | 32.1 | 88.3 |
| Comparative Example 7 | 20 | 0.002 | 0.001 | 0.002 | 0.001 | 0.006 | X | 3.7 | 10.3 |
| Comparative Example 8 | 20 | 26 | 1.3 | 0.8 | 2.5 | 30.6 | X | 35.6 | 99.1 |
| Comparative Example 9 | 20 | 3.2 | 1.2 | 0.4 | 20 | 24.8 | X | 43.6 | 102.3 |

Comparative Example 1

In Comparative Example 1, high purity copper (Cu) having a purity level of 6N was melted using a carbon crucible in a high vacuum atmosphere. Moreover, high purity manganese (Mn) having a purity level of 5N was adjusted, and put into the molten metal of copper. The Mn content was adjusted to 0.05 wt %.

After melting Mn without adding the additive elements, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Comparative Example 1 was sputtered to form a thin film, and the generation of particles was evaluated as with Example 1.

As shown in Table 1, the machinability upon producing the target of Comparative Example 1 was inferior. With the thin film formed by using the target of Comparative Example 1, the generation of particles was low with the number of particles of 0.08 μm or larger being 9.5 particles/wafer and the number of particles of 0.2 μm or larger being 3.1 particles/wafer. The cause of inferior machinability is considered to a result of the insufficient total content of Ca, P, 5, and Si.

Example 2

In Example 2, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 2.48 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 2 was sputtered to form a thin film, and the generation of particles was evaluated as with Example 1.

As shown in Table 1, the machinability upon producing the target of Example 2 was extremely favorable. With the thin film formed by using the target of Example 2, the generation of particles was low with the number of particles of 0.08 μm or larger being 12.8 particles/wafer and the number of particles of 0.2 μm or larger being 4.2 particles/wafer.

Comparative Example 2

In Comparative Example 2, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 28.5 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 2 was sputtered to form a thin film, and the generation of particles was evaluated as with Example 1.

As shown in Table 1, the machinability upon producing the target of Comparative Example 2 was inferior. With the thin film formed by using the target of Comparative Example 2, the generation of particles was high with the number of particles of 0.08 μm or larger being 89.3 particles/wafer and the number of particles of 0.2 μm or larger being 35.3 particles/wafer. The obtained thin film was inferior. It was confirmed that, when the total content of Ca, P, S, and Si is excessive, this results in inferior cutting and increase in the generation of particles.

Example 3

In Example 3, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 15.08 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 3 was sputtered to form a thin film, and the generation of particles was evaluated as with Example 1.

As shown in Table 1, the machinability upon producing the target of Example 3 was extremely favorable. With the thin film formed by using the target of Example 3, the generation of particles was low with the number of particles of 0.08 μm or larger being 23.9 particles/wafer and the number of particles of 0.2 μm or larger being 6.2 particles/wafer.

Comparative Example 3

In Comparative Example 3, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 25.9 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 3 was sputtered to form a thin film, and the generation of particles was evaluated as with Example 1.

As shown in Table 1, the machinability upon producing the target of Comparative Example 3 was inferior. With the thin film formed by using the target of Comparative Example 3, the generation of particles was high with the number of particles of 0.08 μm or larger being 98.7 particles/wafer and the number of particles of 0.2 μm or larger being 23.2 particles/wafer, and the obtained thin film was inferior. It was confirmed that, when the total content of Ca, P, S, and Si is excessive, this results in inferior cutting and increase in the generation of particles.

Example 4

In Example 4, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 0.04 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 4 was sputtered to form a thin film, and the generation of particles was evaluated as with Example 1.

As shown in Table 1, the machinability upon producing the target of Example 4 was favorable. With the thin film formed by using the target of Example 4, the generation of particles was low with the number of particles of 0.08 μm or larger being 10.4 particles/wafer and the number of particles of 0.2 μm or larger being 3.3 particles/wafer.

Comparative Example 4

In Comparative Example 4, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 5 wt %.

After melting Mn without adding the additive elements, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and impurity element content and the evaluation result of machinability of the target as with Example 1 are similarly shown in Table 1. The total content of Ca, P, S, and Si was 0.007 wtppm.

Subsequently, for the quality evaluation of the thin film formed by sputtering the obtained target, the target of Comparative Example 4 was sputtered to form a thin film, and the generation of particles was evaluated as with Example 1.

As shown in Table 1, the machinability upon producing the target of Comparative Example 4 was inferior. With the thin film formed by using the target of Comparative Example 4, the generation of particles was low with the number of particles of 0.08 μm or larger being 9.8 particles/wafer and the number of particles of 0.2 μm or larger being 3.4 particles/wafer. The cause of inferior machinability is considered to a result of the insufficient total content of Ca, P, S, and Si.

Example 5

In Example 5, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 2.48 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 5 was sputtered to form a thin film, and the generation of particles was evaluated as with Example 1.

As shown in Table 1, the machinability upon producing the target of Example 5 was extremely favorable. With the thin film formed by using the target of Example 5, the generation of particles was low with the number of particles of 0.08 μm or larger being 13.6 particles/wafer and the number of particles of 0.2 μm or larger being 4.6 particles/wafer.

Comparative Example 5

In Comparative Example 5, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 27.7 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 5 was sputtered to form a thin film, and the generation of particles was evaluated as with Example 1.

As shown in Table 1, the machinability upon producing the target of Comparative Example 5 was inferior. With the thin film formed by using the target of Comparative Example 5, the generation of particles was high with the number of particles of 0.08 μm or larger being 87.3 particles/wafer and the number of particles of 0.2 μm or larger being 26.9 particles/wafer. It was confirmed that, when the total content of Ca, P, S, and Si is excessive, this results in inferior cutting and increase in the generation of particles.

Example 6

In Example 6, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 15.1 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 6 was sputtered to form a thin film, and the generation of particles was evaluated as with Example 1.

As shown in Table 1, the machinability upon producing the target of Example 6 was extremely favorable. With the thin film formed by using the target of Example 6, the generation of particles was low with the number of particles of 0.08 μm or larger being 23.4 particles/wafer and the number of particles of 0.2 μm or larger being 5.7 particles/wafer.

Comparative Example 6

In Comparative Example 6, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 32.1 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 6 was sputtered to form a thin film, and the generation of particles was evaluated as with Example 1.

As shown in Table 1, the machinability upon producing the target of Comparative Example 6 was inferior. With the thin film formed by using the target of Comparative Example 6, the generation of particles was high with the number of particles of 0.08 μm or larger being 88.3 particles/wafer and the number of particles of 0.2 μm or larger being 32.1 particles/wafer. It was confirmed that, when the total content of Ca, P, S, and Si is excessive, this results in inferior cutting and increase in the generation of particles.

Example 7

In Example 7, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 0.08 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 7 was sputtered to form a thin film, and the generation of particles was evaluated as with Example 1.

As shown in Table 1, the machinability upon producing the target of Example 7 was favorable. With the thin film formed by using the target of Example 7, the generation of particles was low with the number of particles of 0.08 µm or larger being 11.2 particles/wafer and the number of particles of 0.2 µm or larger being 3.5 particles/wafer.

Comparative Example 7

In Comparative Example 7, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 20 wt %.

After melting Mn without adding the additive elements, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and impurity element content and the evaluation result of machinability of the target as with Example 1 are similarly shown in Table 1. The total content of Ca, P, S, and Si was 0.006 wtppm.

Subsequently, for the quality evaluation of the thin film formed by sputtering the obtained target, the target of Comparative Example 7 was sputtered to form a thin film, and the generation of particles was evaluated as with Example 1.

As shown in Table 1, the machinability upon producing the target of Comparative Example 7 was inferior. With the thin film formed by using the target of Comparative Example 7, the generation of particles was low with the number of particles of 0.08 µm or larger being 10.3 particles/wafer and the number of particles of 0.2 µm or larger being 3.7 particles/wafer. The cause of inferior machinability is considered to a result of the insufficient total content of Ca, P, S, and Si.

Example 8

In Example 8, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 2.48 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 8 was sputtered to form a thin film, and the generation of particles was evaluated as with Example 1.

As shown in Table 1, the machinability upon producing the target of Example 8 was favorable. With the thin film formed by using the target of Example 8, the generation of particles was low with the number of particles of 0.08 µm or larger being 11.9 particles/wafer and the number of particles of 0.2 µm or larger being 4.3 particles/wafer.

Comparative Example 8

In Comparative Example 8, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 30.6 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 8 was sputtered to form a thin film, and the generation of particles was evaluated as with Example 1.

As shown in Table 1, the machinability upon producing the target of Comparative Example 8 was inferior. With the thin film formed by using the target of Comparative Example 8, the generation of particles was significantly high with the number of particles of 0.08 µm or larger being 99.1 particles/wafer and the number of particles of 0.2 µm or larger being 35.6 particles/wafer. It was confirmed that, when the total content of Ca, P, S, and Si is excessive, this results in inferior cutting and increase in the generation of particles.

Example 9

In Example 9, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 18.11 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 9 was sputtered to form a thin film, and the generation of particles was evaluated as with Example 1.

As shown in Table 1, the machinability upon producing the target of Example 9 was favorable. With the thin film formed by using the target of Example 9, the generation of particles was low with the number of particles of 0.08 μm or larger being 19.7 particles/wafer and the number of particles of 0.2 μm or larger being 6.6 particles/wafer.

Comparative Example 9

In Comparative Example 9, high purity copper (Cu) having a purity level of 4N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 24.8 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 2.3 to obtain a diameter of 200. Subsequently, the ingot was rolled at a rolling reduction of 50% to obtain a target size of 440 (diameter)×10 (thickness).

Subsequently, after subjecting the target to heat treatment at 300° C. for 15 minutes, the overall target was quenched to obtain a target material. The obtained target material was subject to machine work and processed into a target having a diameter of 430 mm and a thickness of 7 mm.

The results of measuring the Mn content and amount of additive elements and the evaluation result of machinability of the target as with Example 1 are similarly shown in Table 1.

Subsequently, for the quality evaluation of the thin film formed by sputtering the obtained target, the target of Comparative Example 9 was sputtered to form a thin film, and the generation of particles was evaluated as with Example 1.

As shown in Table 1, the machinability upon producing the target of Comparative Example 9 was inferior. With the thin film formed by using the target of Comparative Example 9, the generation of particles was significantly high with the number of particles of 0.08 μm or larger being 102.3 particles/wafer and the number of particles of 0.2 μm or larger being 43.6 particles/wafer. It was confirmed that, when the total content of Ca, P, S, and Si is excessive, this results in inferior cutting and increase in the generation of particles.

Example 10

In Example 10, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 0.01 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 10 was sputtered to form a thin film, and the generation of particles was evaluated as with Example 1.

As shown in Table 1, the machinability upon producing the target of Example 10 was favorable. With the thin film formed by using the target of Example 10, the generation of particles was low with the number of particles of 0.08 μm or larger being 10.9 particles/wafer and the number of particles of 0.2 μm or larger being 3.2 particles/wafer.

Example 11

In Example 11, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 0.05 wt %, and the total amount of additive elements was adjusted to 19.05 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 11 was sputtered to form a thin film, and the generation of particles was evaluated as with Example 1.

As shown in Table 1, the machinability upon producing the target of Example 11 was favorable. With the thin film formed by using the target of Example 11, the generation of particles was low with the number of particles of 0.08 µm or larger being 22.9 particles/wafer and the number of particles of 0.2 µm or larger being 5.9 particles/wafer.

Example 12

In Example 12, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 0.01 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains. The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 12 was sputtered to form a thin film, and the generation of particles was evaluated as with Example 1.

As shown in Table 1, the machinability upon producing the target of Example 12 was favorable. With the thin film formed by using the target of Example 12, the generation of particles was low with the number of particles of 0.08 µm or larger being 11.3 particles/wafer and the number of particles of 0.2 µm or larger being 3.1 particles/wafer.

Example 13

In Example 13, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 5 wt %, and the total amount of additive elements was adjusted to 19.05 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 13 was sputtered to form a thin film, and the generation of particles was evaluated as with Example 1.

As shown in Table 1, the machinability upon producing the target of Example 13 was favorable. With the thin film formed by using the target of Example 13, the generation of particles was low with the number of particles of 0.08 µm or larger being 25.3 particles/wafer and the number of particles of 0.2 µm or larger being 6.2 particles/wafer.

Example 14

In Example 14, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 0.01 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 14 was sputtered to form a thin film, and the generation of particles was evaluated as with Example 1.

As shown in Table 1, the machinability upon producing the target of Example 14 was favorable. With the thin film formed by using the target of Example 14, the generation of particles was low with the number of particles of 0.08 μm or larger being 13.2 particles/wafer and the number of particles of 0.2 μm or larger being 3.5 particles/wafer.

Example 15

In Example 15, high purity copper (Cu) having a purity level of 5N5 was melted using a carbon crucible in a high vacuum atmosphere. Moreover, high purity manganese (Mn) having a purity level of 5N was adjusted, and put into the molten metal of copper. The Mn content was adjusted to 20 wt %, and the total amount of additive elements was adjusted to 19.05 wtppm.

After incorporating Mn and the additive elements of Ca, P, S, and Si to be subject to further melting, the obtained molten metal of the copper-manganese alloy was cast into a water-cooled copper mold in a high vacuum atmosphere to obtain an ingot. Subsequently, the surface layer of the produced ingot was eliminated to obtain a size of 180 (diameter)×60 (thickness), and forged at a forging ratio of 4.8 to obtain a diameter of 200. Subsequently, the ingot was rolled at a rolling reduction of 60% to obtain a target size of 440 (diameter)×10 (thickness).

Subsequently, after subjecting the target to heat treatment at 350° C. for one hour, the overall target was quenched to obtain a target material. The obtained target material was subject to machine work and processed into a target having a diameter of 430 mm and a thickness of 7 mm.

Upon preparing this target, cutting (grinding) and polishing were performed using a rotating body comprising abrasive grains.

The results of measuring the Mn content and amount of additive elements (impurity element content) and the evaluation result of machinability of the target as with Example 1 are similarly shown in Table 1.

Subsequently, for the quality evaluation of the thin film formed by sputtering the obtained target, the target of Example 15 was sputtered to form a thin film, and the generation of particles was evaluated as with Example 1.

As shown in Table 1, the machinability upon producing the target of Example 15 was favorable. With the thin film formed by using the target of Example 15, the generation of particles was low with the number of particles of 0.08 μm or larger being 22.1 particles/wafer and the number of particles of 0.2 μm or larger being 7.9 particles/wafer.

INDUSTRIAL APPLICABILITY

The present invention improves the machinability of the target material by adding, to copper, an appropriate amount of Mn, and additive elements within a harmless range. Upon preparing a target, a copper-manganese alloy ingot obtained through melting and casting is processed into a target shape of a predetermined size, and the surface is thereafter cut to obtain the target. By improving the machinability of the target material, the present invention yields a superior effect of being able to improve the workability of the target, improve the smoothness of the target surface, and inhibit the generation of particles during sputtering.

Consequently, it is possible to improve the yield and reliability of semiconductor products that progress toward miniaturization and integration. The present invention is useful for forming a copper alloy wiring for semiconductors, which comprises a self-diffusion suppression function that is a unique feature of a high purity copper-manganese alloy, is capable of effectively preventing the contamination around the wiring caused by the diffusion of active Cu, and has superior electromigration (EM) resistance, corrosion resistance, and the like.

The invention claimed is:

1. A high purity copper-manganese alloy sputtering target of a uniform Cu—Mn alloy composition consisting of Mn in an amount of 0.05 to 20 wt %, a total content in combination of P, S, Ca, and Si of 0.01 to 20 wtppm, and a remainder of Cu and unavoidable impurities, wherein individual contents of P and S in the combination of P, S, Ca, and Si are 0.001 to 0.06 wtppm of P and 0.005 to 5 wtppm of S, and wherein individual contents of Ca and Si in the combination of P, S, Ca, and Si are 0.001 to 13 wtppm of Ca and 0.001 to 7 wtppm of Si.

2. A high purity copper-manganese alloy sputtering target according to claim 1, wherein the total content in combination of P, S, Ca, and Si is 0.1 to 15 wtppm.

3. A high purity copper-manganese alloy sputtering target according to claim 1, wherein the Cu—Mn composition has a purity of at least 99.995% (4N5) when excluding the total content of P, S, Ca, and Si from a determination of the purity.

4. A high purity copper-manganese alloy sputtering target according to claim 1, wherein the amount of Mn in the Cu—Mn alloy composition is 0.4 to 10 wt %.

5. A high purity copper-manganese alloy sputtering target according to claim 1, wherein the amount of Mn in the Cu—Mn alloy composition is 5 to 20 wt %.

6. A high purity copper-manganese alloy sputtering target of a uniform Cu—Mn alloy composition consisting of Mn in an amount of 0.05 to 20 wt %, a total content in combination of P, S, Ca, and Si of 0.01 to 20 wtppm, one or more additive elements selected from a group consisting of Sb, Zr, Ti, Cr, Ag, Au, Cd, In, As, Be, B, Mg, Al, Ba, La, and Ce in a total amount of 500 wtppm or less, and a remainder of Cu and unavoidable impurities, wherein individual contents of P and S in the combination of P, S, Ca, and Si are 0.001 to 0.06 wtppm of P and 0.005 to 5 wtppm of S, and wherein individual contents of Ca and Si in the combination of P, S, Ca, and Si are 0.001 to 13 wtppm of Ca and 0.001 to 7 wtppm of Si.

7. A high purity copper-manganese alloy sputtering target according to claim 6, wherein the total content in combination of P, S, Ca, and Si is 0.1 to 15 wtppm.

8. A high purity copper-manganese alloy sputtering target according to claim 6, wherein the Cu—Mn composition has a purity of at least 99.995% (4N5) when excluding the total content of P, S, Ca, and Si and said one or more additive elements selected from the group consisting of Sb, Zr, Ti, Cr, Ag, Au, Cd, In, As, Be, B, Mg, Al, Ba, La, and Ce from a determination of the purity.

9. A high purity copper-manganese alloy sputtering target according to claim 6, wherein said one or more additive elements is selected from the group consisting of Sb, Zr, Ti, Ag, Au, Cd, In, As, Be, B, Mg, Al, Ba, La, and Ce.

10. A high purity copper-manganese alloy sputtering target according to claim 6, wherein the amount of Mn in the Cu—Mn alloy composition is 0.4 to 10 wt %.

11. A high purity copper-manganese alloy sputtering target according to claim 6, wherein the amount of Mn in the Cu—Mn alloy composition is 5 to 20 wt %.

* * * * *